(12) United States Patent
Morishita

(10) Patent No.: US 8,325,240 B2
(45) Date of Patent: Dec. 4, 2012

(54) DATA TRANSFER DEVICE AND ELECTRONIC CAMERA

(75) Inventor: Akihiko Morishita, Hiratsuka (JP)

(73) Assignee: Nikon Corporation, Tokyo (JP)

( * ) Notice: Subject to any disclaimer, the term of this patent is extended or adjusted under 35 U.S.C. 154(b) by 794 days.

(21) Appl. No.: 12/314,413

(22) Filed: Dec. 10, 2008

(65) Prior Publication Data

US 2009/0167390 A1 Jul. 2, 2009

(30) Foreign Application Priority Data

Dec. 26, 2007 (JP) .................................. 2007-334514

(51) Int. Cl.
*H04N 5/225* (2006.01)
(52) U.S. Cl. ................. 348/207.99; 348/222.1
(58) Field of Classification Search .................. None
See application file for complete search history.

(56) References Cited

U.S. PATENT DOCUMENTS
7,555,048 B1 * 6/2009 Massoumi et al. ............ 375/260

FOREIGN PATENT DOCUMENTS
JP A-11-003135 1/1999
* cited by examiner

*Primary Examiner* — Chieh M Fan
*Assistant Examiner* — Angel L Garces-Rivera
(74) *Attorney, Agent, or Firm* — Oliff & Berridge, PLC

(57) ABSTRACT

A data transfer device can adjust a phase of a clock signal with a simple configuration in a short period of time when transferring a digital data signal in synchronization with the clock signal. Accordingly, the data transfer device includes a data transfer line serially transferring the data signal, a clock transfer line transferring the clock signal, a decision unit deciding an adjustment amount by which the phase of the clock signal accompanying the data signal is shifted, the adjustment amount being used when transferring the data signal in synchronization with the clock signal, and a phase adjusting unit shifting the phase of the clock signal in accordance with the adjustment amount decided by the decision unit while keeping a frequency of the clock signal fixed.

10 Claims, 14 Drawing Sheets

DATA TRANSFER DEVICE AND ELECTRONIC CAMERA

CROSS REFERENCE TO THE RELATED APPLICATIONS

This application is based upon and claims the benefit of priority from Japanese Patent Application No. 2007-334514, filed on Dec. 26, 2007, the entire contents of which are incorporated herein by reference.

BACKGROUND

1. Field

The present application relates to a data transfer device suitable for transferring digital data in high speed between electronic devices or between semiconductor elements and peripheral techniques of the data transfer device.

2. Description of the Related Art

Conventionally, it has been required to speed up a transfer of digital data. As a more secure and safer scheme, a data transfer of serial transmission scheme has been widely adopted. In this serial transmission scheme, a clock signal to be a reference for the transmission is transmitted, as a carrier wave, simultaneously with digital data, thereby enhancing a reliability of the data transfer.

However, in general, when the clock signal is used, the reliability of the transfer is enhanced, but, on the other hand, a phase of the clock signal with respect to the digital data may be shifted due to an influence of a transmission path and the like. In order to deal with such a problem, it is conceivable to previously perform a calculation of the transmission path using information and to reflect the calculation result on an A/W of a mount substrate, but, it takes time and there is a problem in terms of cost. Accordingly, techniques for adjusting the phase of the clock signal such as an application disclosed in, for example, Japanese Unexamined Patent Application Publication No. H11-3135 have been contrived.

In the above application, a phase comparison between digital data and a clock signal is performed, and a phase of the clock signal which is supplied to both a data output side and a data input side is adjusted based on the comparison result, to thereby deal with the aforementioned problem. However, in the above application, the configuration is complicated and it requires time for the adjustment.

SUMMARY

A proposition is to enable to adjust a phase of a clock signal with a simple configuration in a short period of time when a digital data signal is transferred in synchronization with the clock signal.

In order to achieve the above-described proposition, a data transfer device being a data transfer device which transfers a digital data signal in synchronization with a clock signal includes: a data transfer line serially transferring the data signal; a clock transfer line transferring the clock signal; a decision unit deciding an adjustment amount by which a phase of the clock signal accompanying the data signal is shifted, the adjustment amount being used when transferring the data signal in synchronization with the clock signal; and a phase adjusting unit shifting the phase of the clock signal in accordance with the adjustment amount decided by the decision unit while keeping a frequency of the clock signal fixed.

Another data transfer device being a data transfer device formed of a transmitting unit transmitting a digital data signal in synchronization with a clock signal and a receiving unit receiving the data signal in synchronization with the clock signal includes: a data transfer line serially transferring the data signal from the transmitting unit to the receiving unit; and a clock transfer line transferring the clock signal from the transmitting unit to the receiving unit, in which the receiving unit includes: a decision unit deciding an adjustment amount by which a phase of the clock signal accompanying the data signal is shifted, the adjustment amount being used when receiving the data signal in synchronization with the clock signal; and a phase adjusting unit shifting the phase of the clock signal in accordance with the adjustment amount decided by the decision unit while keeping a frequency of the clock signal fixed.

Still another data transfer device being a data transfer device formed of a transmitting unit transmitting a digital data signal in synchronization with a clock signal and a receiving unit receiving the data signal in synchronization with the clock signal includes: a data transfer line serially transferring the data signal from the transmitting unit to the receiving unit; and a clock transfer line transferring the clock signal from the transmitting unit to the receiving unit, in which the transmitting unit includes: a decision unit deciding an adjustment amount by which a phase of the clock signal accompanying the data signal is shifted, the adjustment amount being used when transmitting the data signal in synchronization with the clock signal; and a phase adjusting unit shifting the phase of the clock signal in accordance with the adjustment amount decided by the decision unit while keeping a frequency of the clock signal fixed.

Yet another data transfer device being a data transfer device formed of a transmitting unit transmitting a digital data signal in synchronization with a clock signal and a receiving unit receiving the data signal in synchronization with the clock signal includes: a data transfer line serially transferring the data signal from the transmitting unit to the receiving unit; and a clock transfer line transferring the clock signal from the transmitting unit to the receiving unit, in which the receiving unit includes: a decision unit deciding an adjustment amount by which a phase of the clock signal accompanying the data signal is shifted, the adjustment amount being used when transmitting the data signal in synchronization with the clock signal by the transmitting unit; and a providing unit providing the adjustment amount decided by the decision unit to the transmitting unit, in which the transmitting unit includes a phase adjusting unit shifting the phase of the clock signal in accordance with the adjustment amount provided by the providing unit while keeping a frequency of the clock signal fixed.

Note that it is possible that the decision unit repeatedly transfers a test signal in synchronization with the clock signal while shifting the phase of the clock signal, the test signal being a digital data signal for test, and decides the adjustment amount based on the transferred test signal and the clock signal.

Further, the test signal can be a binary signal whose signal values alternately change in the same cycle as that of the clock signal.

Furthermore, it is also possible that the data transfer device includes a plurality of the data transfer lines, and the decision unit transfers the test signal with respect to each of the plurality of the transfer lines in synchronization with the clock signal and decides the adjustment amount based on a synthesized signal of a plurality of transferred test signals and the clock signal.

An electronic camera includes any one of the aforementioned data transfer devices and an image-capturing unit capturing a subject image and generating a digital image signal, in which the data transfer line serially transfers the image signal as the data signal.

Note that the decision unit may decide the adjustment amount right before serially transferring the image signal.

DETAILED DESCRIPTION OF THE EMBODIMENTS

<Explanation of One Embodiment>

Figure 1:
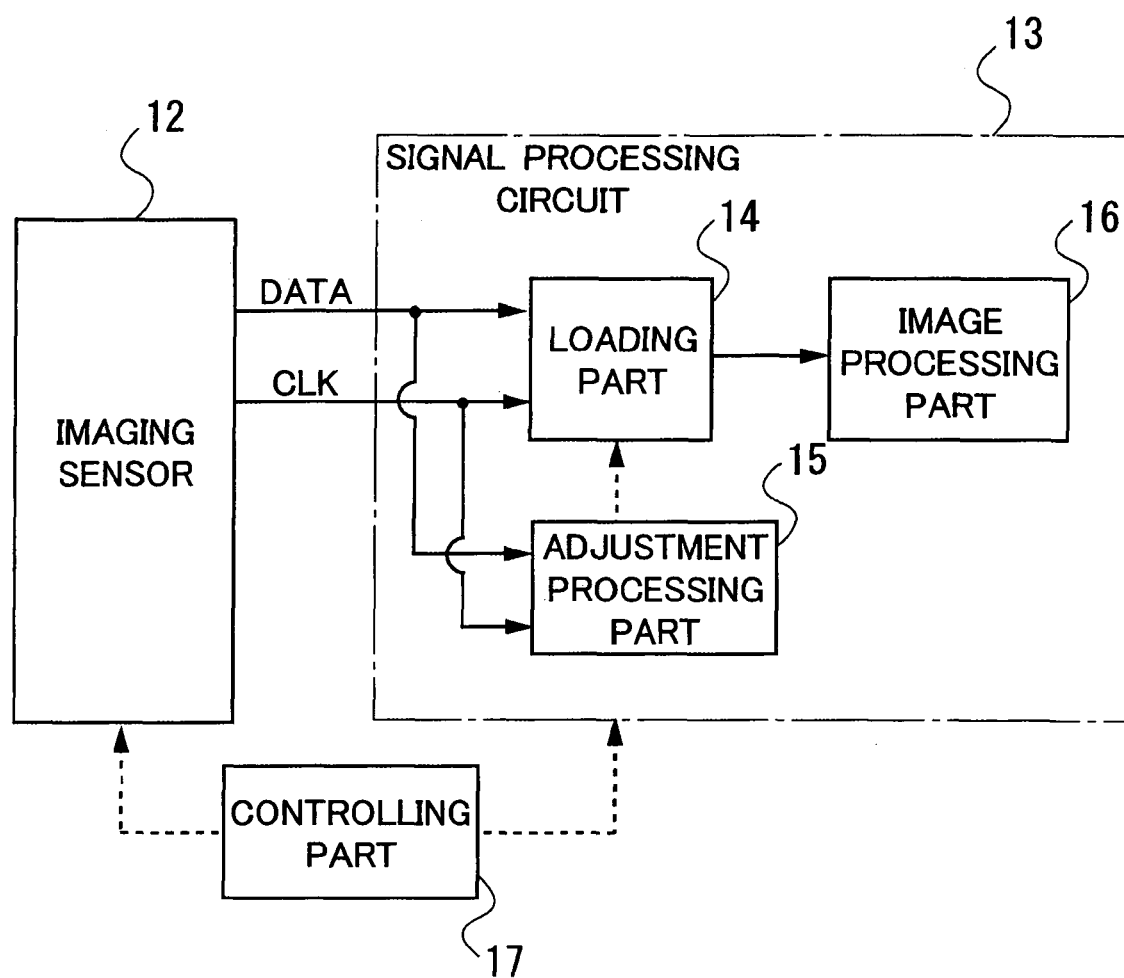
FIG. 1 is a schematic view showing a configuration example of a data transfer device according to one embodiment.

FIG. 1 is a schematic view showing a configuration example of a data transfer device according to one embodiment. FIG. 1 shows the configuration example when an imaging sensor 12 of an electronic camera is set as an output device and a signal processing circuit 13 of the electronic camera is set as an input device.

The imaging sensor 12 of the one embodiment has a light-receiving surface on which a plurality of light-receiving elements are two-dimensionally arranged, and outputs an image signal of a subject image which is image-formed on the light-receiving surface with an imaging optical system (not shown). Further, the imaging sensor 12 has an A/D conversion circuit (not shown) on a chip, and a digital data signal is output from an output terminal of the imaging sensor 12.

Here, to the imaging sensor 12 of the one embodiment, one ends of a plurality of signal lines which serially transfer image signals (details will be described later) and one end of a signal line (CLK) which outputs a clock signal are coupled. The other ends of the aforementioned respective signal lines are coupled to the signal processing circuit 13, respectively, and through a data transfer between the imaging sensor 12 and the signal processing circuit 13, the image signals can be transferred in a serial scheme using the plurality of signal lines. Note that the imaging sensor 12 also has a function of outputting later-described test data to the plurality of signal lines.

The signal processing circuit 13 is a digital front-end circuit which performs various types of image processings on the digital image signals input from the imaging sensor 12. The signal processing circuit 13 includes a loading part 14 which performs a normal loading of the image signals, an adjustment processing part 15 and an image processing part 16. Note that the image processing part 16 is an ASIC which performs various types of image processings (a defective pixel correction, a color interpolation, a gray level correction, a white balance adjustment, an edge enhancement, and the like) on the digital image signals.

The image signals and the clock signal transferred from the imaging sensor 12 to the signal processing circuit 13 are selectively input into either of the aforementioned loading part 14 or the adjustment processing part 15. This selection is realized by a switching circuit or the like. Further, the adjustment processing part 15 provides a later-described "shifting amount of phase of the clock signal" to the loading part 14. Further, the imaging sensor 12 and the signal processing circuit 13 are controlled by a controlling part 17 which centrally controls the respective parts.

Figure 2:
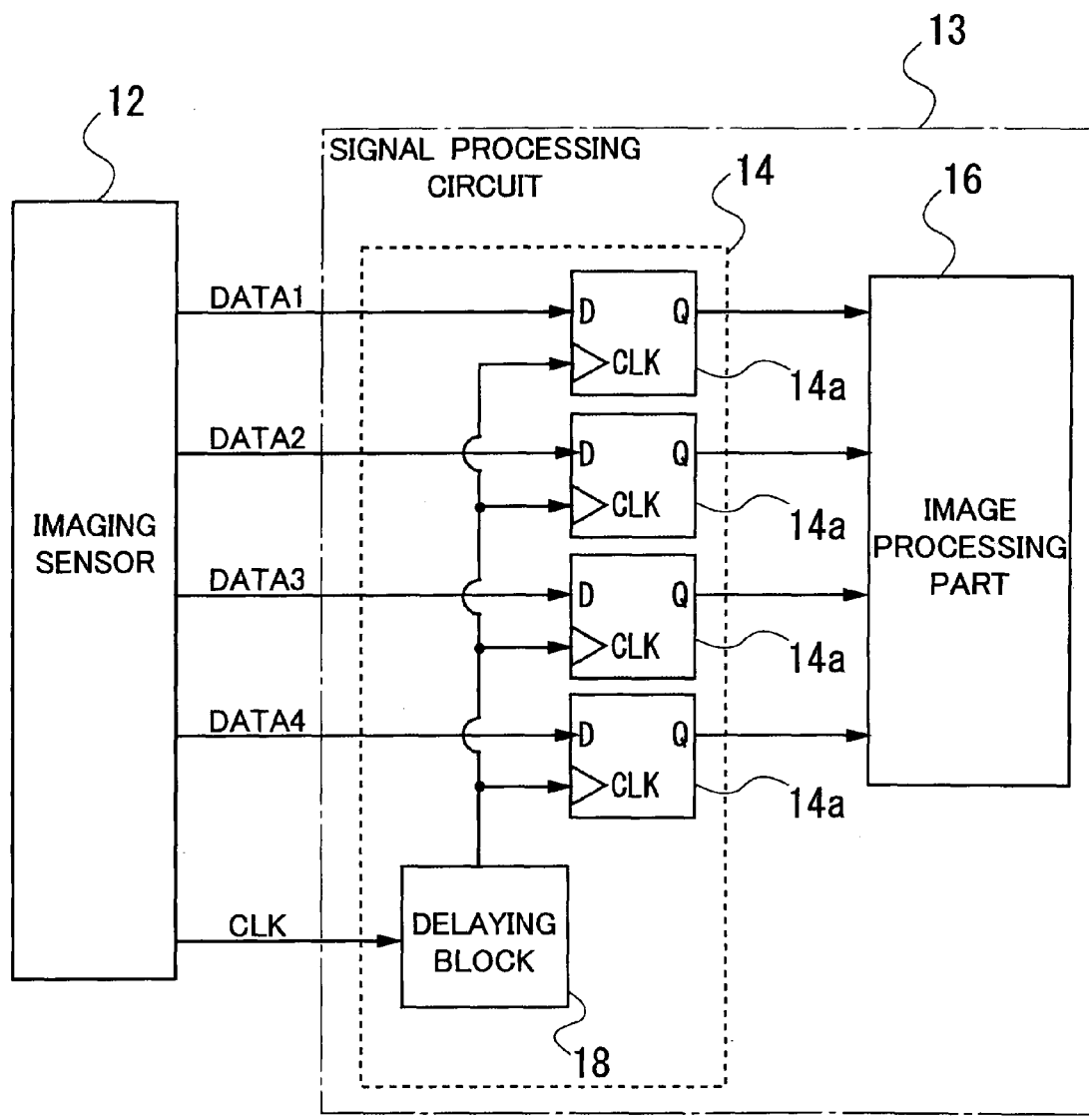
FIG. 2 is a schematic view which explains a loading part 14.

Next, a case where the image signals and the clock signal transferred from the imaging sensor 12 to the signal processing circuit 13 are input into the loading part 14 will be described with reference to FIG. 2. Hereinbelow, an explanation will be made by citing a case where four signal lines which serially transfer the image signals are provided, as an example. Further, the image signals to be transferred by each of the signal lines are respectively called as "DATA 1", "DATA 2", "DATA 3" and "DATA 4". As shown in FIG. 2, the loading part 14 provides each of the four signal lines with a loading circuit 14a which loads a value indicated by the image signal in synchronization with a rising edge timing or a falling edge timing of the clock signal. Outputs of the respective loading circuits 14a are input into the image processing part 16.

Figure 3:
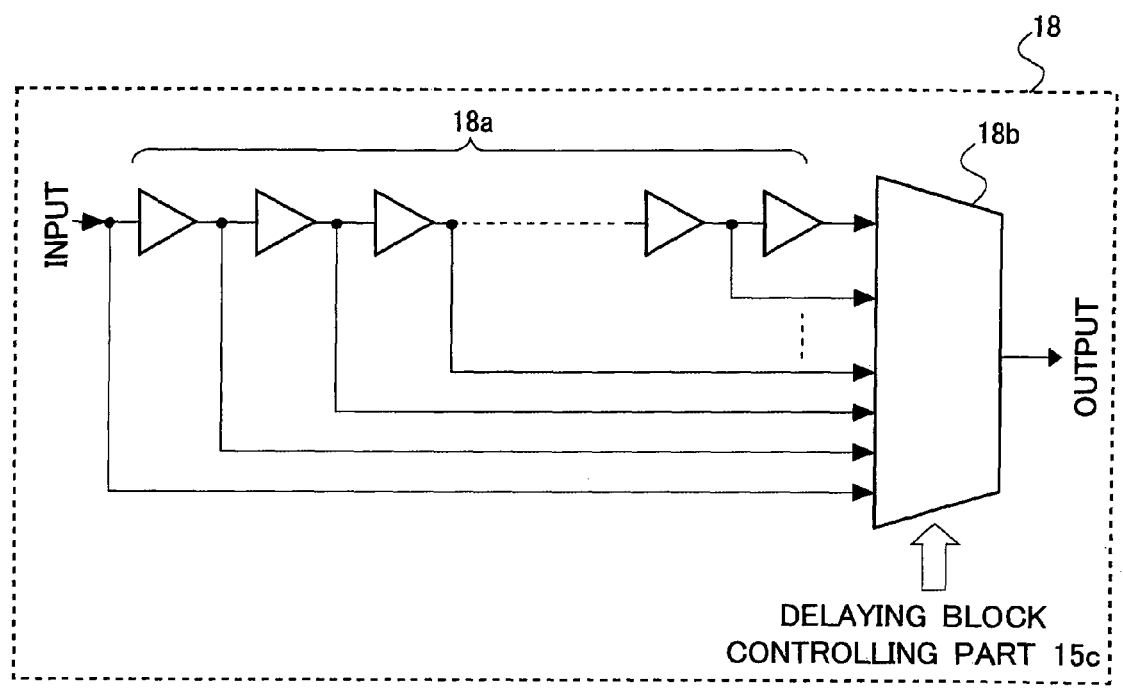
FIG. 3 is a schematic view which explains a delaying block 18.

In addition, the loading part 14 includes a delaying block 18 which controls a delay amount of the clock signal transferred from the imaging sensor 12. As shown in FIG. 3, the delaying block 18 includes N number of delaying parts 18a and a selector 18b. By controlling the number of delaying parts 18a through which the clock signal transferred from the imaging sensor 12 passes, the delay amount of the clock signal is controlled. As above, by controlling the delay amount of the clock signal, it is possible to shift the phase of the clock signal. An output of the delaying block 18 is input into each of the four loading circuits 14a.

Figure 4:
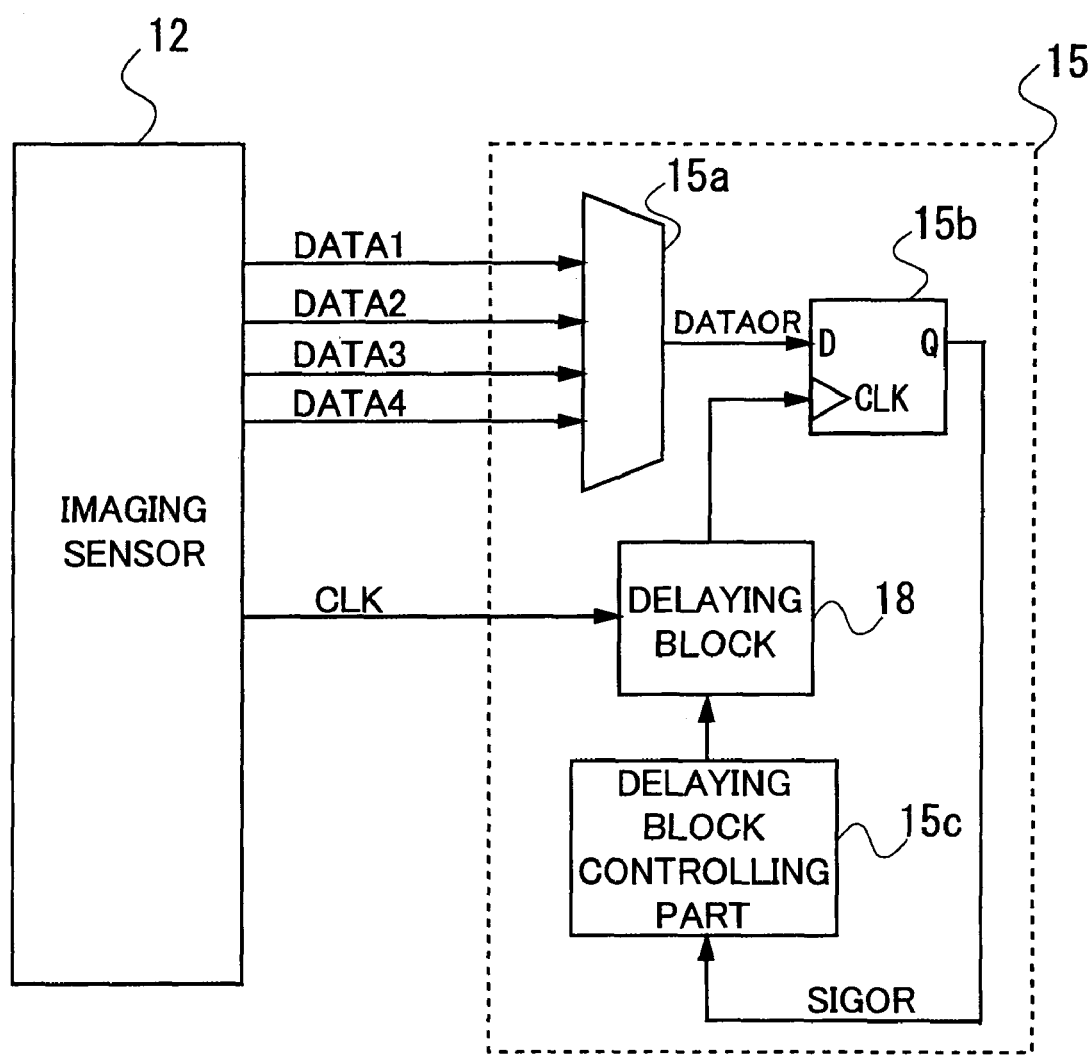
FIG. 4 is a schematic view which explains an adjustment processing part 15.

Next, a case where the image signals and the clock signal transferred from the imaging sensor 12 to the signal processing circuit 13 are input into the adjustment processing part 15 will be described with reference to FIG. 4. As shown in FIG. 4, the adjustment processing part 15 includes: a calculating circuit 15a which takes an OR of the image signals (DATA 1 to 4) to be transferred through the plurality of signal lines and determines DATAOR being a synthesized signal of the image signals (DATA 1 to 4); a loading circuit 15b which loads a value indicated by the DATAOR in synchronization with the rising edge timing or the falling edge timing of the clock signal; a delaying block controlling part 15c; and the aforementioned delaying block 18 which was explained in the description regarding the loading part. The delaying block 18 is used by both the loading part 14 and the adjustment processing part 15.

Figure 5:
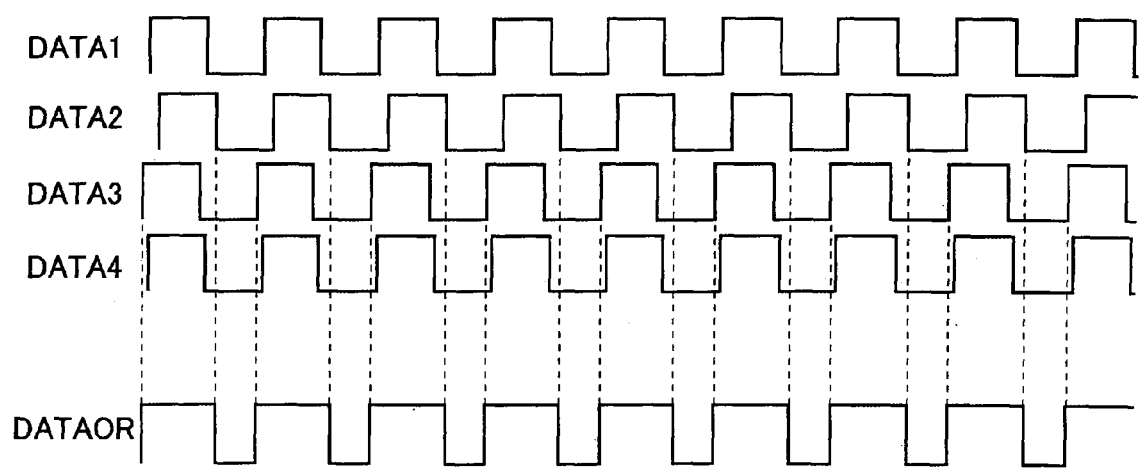
FIG. 5 is a schematic view which explains DATAOR.

The DATAOR will be explained with reference to FIG. 5. As shown in FIG. 5, phase differences are generated among the image signals DATA 1 to 4 due to an influence of their signal lines (transmission paths) and the like. Accordingly, there are a lot of cases where a duty ratio of the DATAOR indicating a total state of the image signals DATA 1 to 4 does not reach 50%, as shown in FIG. 5.

Further, there is a case where the phase of the clock signal is also shifted from ideal 90 degrees with respect to the DATAOR. Specifically, not only shifts among each of the image signals to be transferred through the four signal lines but also shifts between the image signals and the clock signal are generated.

Figure 6A:
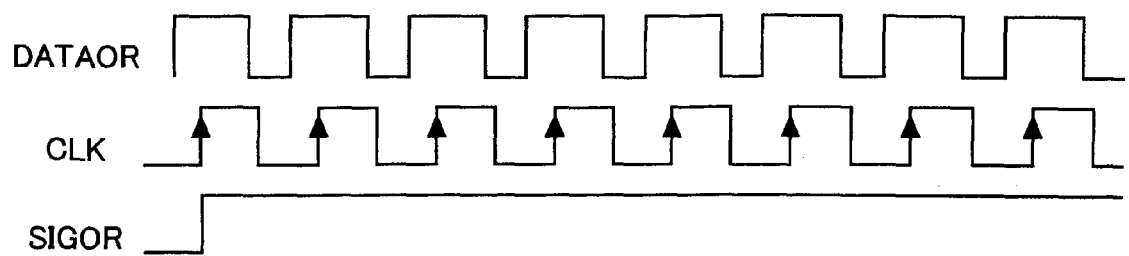
FIG. 6A is a schematic view which explains a SIGOR.
Figure 6B:
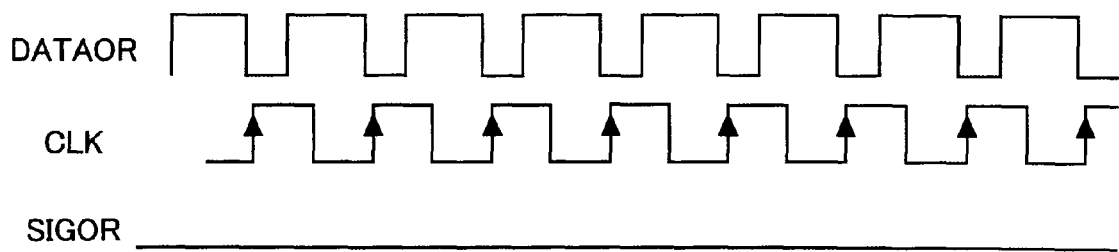
FIG. 6B is another schematic view which explains the SIGOR.

For instance, as shown in FIG. 6A, if a rising edge of the clock signal appears when the DATAOR is in a High state, a SIGOR being a signal latched at the rising edge of the clock signal becomes constantly in a High state. Meanwhile, as shown in FIG. 6B, if the rising edge of the clock signal appears when the DATAOR is in a Low state, the SIGOR being the signal latched at the rising edge of the clock signal becomes constantly in a Low state. Namely, the sate of SIGOR indicates a synchronous state between the DATAOR and the clock signal.

Accordingly, a point where the SIGOR changes from the High state to the Low state or a point where the SIGOR changes from the Low state to the High state is a timing when the SIGOR becomes unstable, so that the phase of the clock signal is only required to be adjusted by avoiding this timing.

Details regarding the adjustment of the phase of the clock signal will be explained using a flow chart of FIG. 7.

In step S1, the controlling part 17 determines whether or not an execution of shooting is instructed by a user via a not-shown operation part. Subsequently, when the execution of shooting is instructed, the controlling part 17 starts preparing a shooting operation similarly as in publicly known techniques, and proceeds to step S2.

In step S2, the controlling part 17 starts a test mode. The test mode is a mode for adjusting the phase of the clock signal. The controlling part 17 notifies both the imaging sensor 12 and the signal processing circuit 13 of the start of the test mode, and proceeds to step S3. When the start of the test mode is notified, the signal processing circuit 13 controls inside the signal processing circuit 13 so that the image signals and the clock signal transferred from the imaging sensor 12 to the signal processing circuit 13 are input into the adjustment processing part 15 as explained in FIG. 4.

In step S3, the controlling part 17 determines whether or not the test mode is one performed for the first time. If the test mode is determined to be the one performed for the first time, the controlling part 17 proceeds to step S4, and if the test mode is determined to be one performed for the second time or thereafter, the controlling part 17 proceeds to later-described step S5.

In step S4, the controlling part 17 performs an initial setting. Note that when the test mode is the one performed for the second time or thereafter, it is possible to estimate that the phase of the clock signal which was set before is close to a current one in an optimum state, so that this initial setting is not necessary.

In step S5, the controlling part 17 controls the imaging sensor 12 and starts a transfer of test data from the imaging sensor 12 to the signal processing circuit 13. In order to easily recognize the state where the image signals DATA 1 to 4 are totalized, the test data is previously set so that "0" and "1" are alternately indicated in the data. An explanation hereinbelow will be made by assuming that the phase of the clock signal at this time is in a state of CLK(1) in FIG. 8.

In step S6, the controlling part 17 controls the adjustment processing part 15 and loads the SIGOR. Subsequently, the controlling part 17 stores the synchronous state between the DATAOR and the clock signal. For instance, when the SIGOR is in the High state, the controlling part 17 stores "1" as the synchronous state, and when the SIGOR is in the Low state, the controlling part 17 stores "0" as the synchronous state. For example, when the phase of the clock signal is in the state of CLK(1) in FIG. 8, the controlling part 17 stores "1" as the synchronous state.

In step S7, the controlling part 17 sets a phase count n to n+1. The controlling part 17 increases the phase count of a not-shown phase counter by one, and shifts the phase of the clock signal by controlling the delaying block controlling part 15c. For instance, if this processing is conducted when the phase of the clock signal is in the state of CLK(1) in FIG. 8, the next clock signal becomes CLK(2).

In step S8, the controlling part 17 determines whether or not M number of loadings are performed. The number of M is a predetermined set number of loadings and is determined according to the number (N number) of delaying parts 18a in the aforementioned delaying block 18 or the like (note that M≦N). The number of M satisfies a formula of M≧5 with respect to two cycles of the clock signal and is preferably an odd number. The controlling part 17 repeats performing the loadings of the SIGOR and the storage of the synchronous state (step S6) and the count of the phase (step S7) until it is determined that the M number of loadings are performed by referring to the not-shown phase counter.

Figure 8:
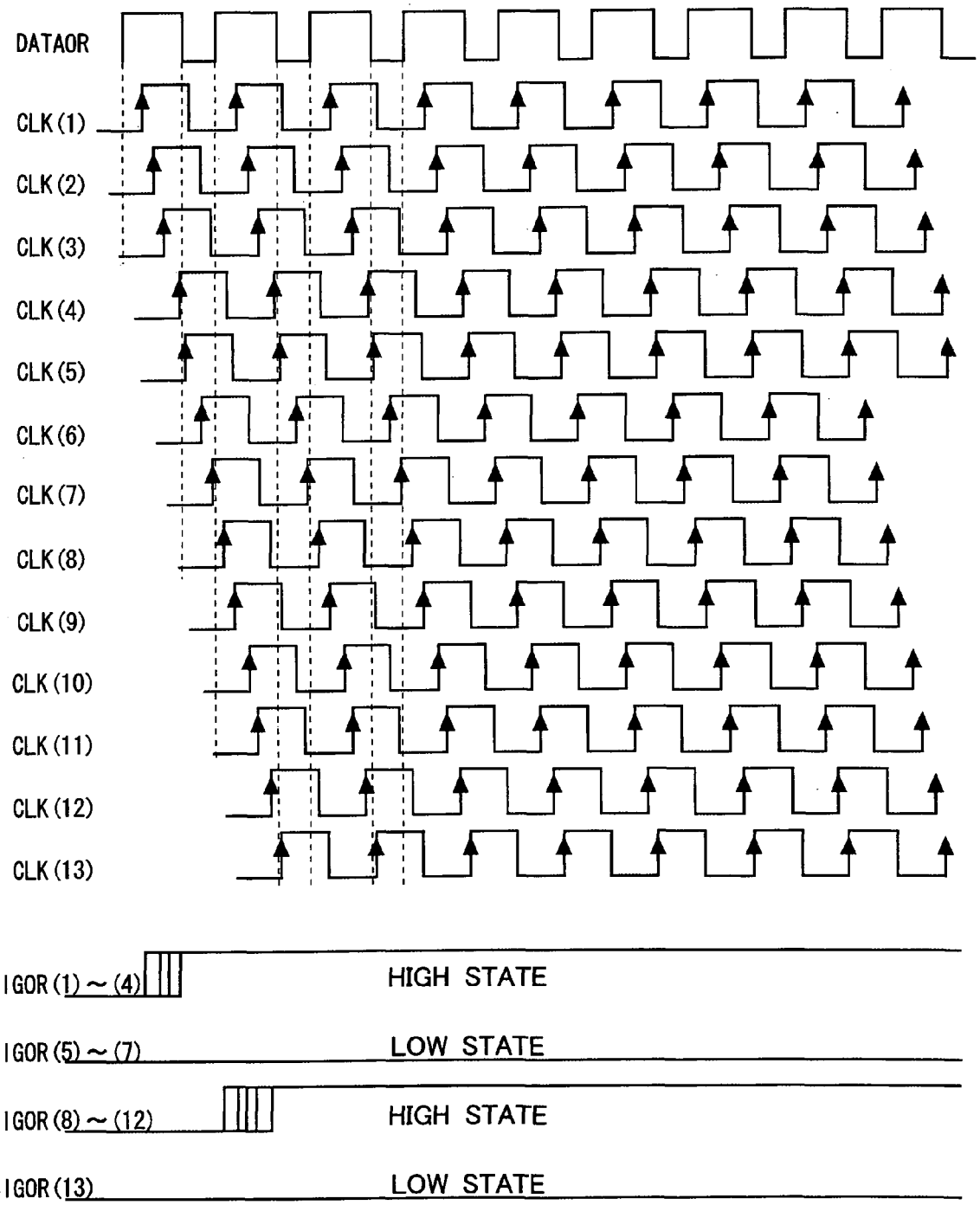
FIG. 8 is a schematic view which explains the adjustment of the phase of the clock signal.

For instance, in an example of FIG. 8, during a period of time when the clock signal changes from CLK(1) to CLK (13), the synchronous state is "1" when the clock signal changes from CLK(1) to CLK(4), and the synchronous state is "0" when the clock signal changes from CLK(5) to CLK (7). Further, when the clock signal changes from CLK(8) to CLK(12), the synchronous state is "1", and when the clock signal is CLK(13), the synchronous state is "0".

In step S9, the controlling part 17 controls the delaying block controlling part 15c, to thereby decide the shifting amount of the phase of the clock signal. In a state where step S9 is conducted, a correlation between the phase count and the synchronous state is obtained. Accordingly, the controlling part 17 decides the shifting amount of the phase of the clock signal based on the correlation.

For instance, as phases of the clock signals in which the synchronous state becomes "1", CLK(8) to CLK(12) are adopted. Subsequently, the controlling part 17 decides the clock signal with the optimum phase among CLK(8) to CLK (12), to thereby decide the shifting amount of the phase of the clock signal. For the decision, methods such as a) to c) described below can be adopted.

a) Method of Adopting an Intermediate Point

An interval between CLK(8) to CLK(12) is five counts, so that CLK(10) which is the third count position being a position of ½ of a count width is adopted.

b) Method of Adopting a Point at a Delayed Side

Among CLK(8) to CLK(12), CLK(11) or CLK(12) at a side having a large amount of delay is adopted.

Figure 9:
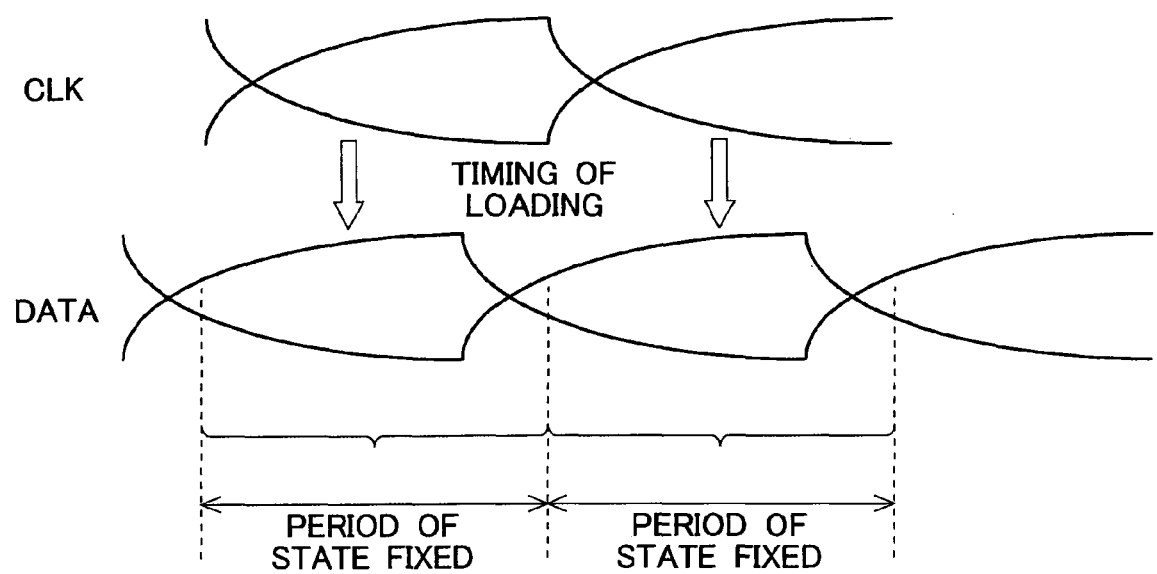
FIG. 9 is a schematic view which explains differential lines.

In general, when transferring digital data in high speed, differential lines shown in FIG. 9 are often used for both the clock signal and the data signal. This is because a resistance to external noise and to internal noise can be enhanced by using the differential lines. Such a differential line is processed by being converted into a rectangular wave at a receiving end.

The differential line has a characteristic that a so-called "blunting of signal" largely appears on a beginning part of the line, as shown in FIG. 9. Accordingly, by adopting the clock signal at an end part of the line, namely, the clock signal at the side having a large amount of delay, it is possible to deal with the "blunting of signal".

c) Method of Adopting a Point at an Advance Side

Among CLK(8) to CLK(12), CLK(8) or CLK(9) at a side having a small amount of delay is adopted. With the use of this method, it is possible to adopt the clock signal being closer to an initial set value, and the number of delaying parts 18a through which the clock signal passes can be further reduced in the delaying block 18.

Note that the clock signal to be adopted can be decided by using a method other than the aforementioned methods of a) to c). Further, if a reason why the clock signal is shifted can be analyzed in a qualitative or quantitative manner, it is also possible to decide the clock signal to be adopted by appropriately switching the aforementioned methods of a) to c) based on the analyzed result.

Further, when it was not possible to decide the clock signal to be adopted, the controlling part 17 performs a processing of d) or e) described below.

d) Error Message is Output

The controlling part 17 determines that a favorable data transfer cannot be conducted, and notifies a user of a warning using a not-shown display part or the like.

Further, it is also possible to configure that the shooting itself is prohibited.

e) Initial Set Value is Adopted

In step S10, the controlling part 17 indicates the shifting amount of the phase of the clock signal decided in step S9 to the delaying block 18, and terminates a series of processings. Note that it is also possible to configure that the controlling part 17 appropriately notifies both the imaging sensor 12 and the signal processing circuit 13 of a completion of the test mode, or the imaging sensor 12 and the signal processing circuit 13 automatically recognize the completion of the test mode at the time when step S8 proceeds to YES. In either case, when the test mode is completed, the image signals and the clock signal transferred from the imaging sensor 12 to the signal processing circuit 13 are input into the loading part 14, and the transfer of the test data from the imaging sensor 12 to the signal processing circuit 13 is terminated.

Figure 10:
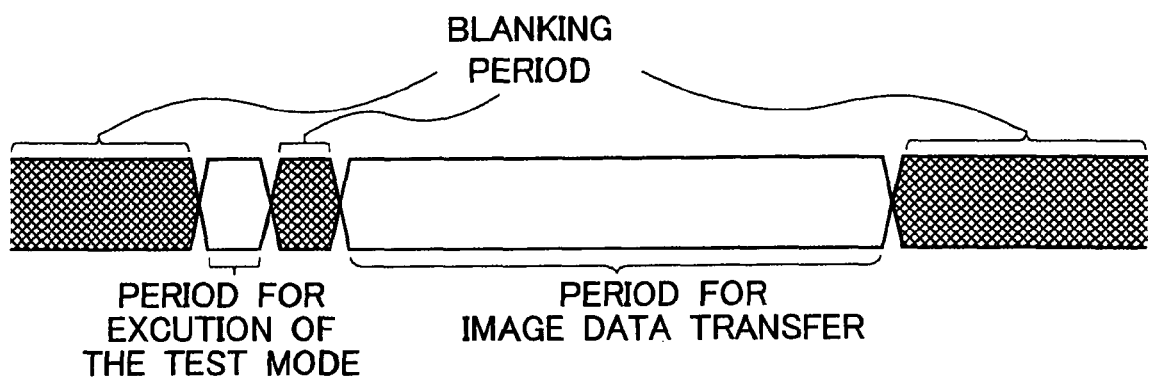
FIG. 10 is a schematic view which explains a timing for adjusting the phase of the clock signal.

Note that the series of processings described above can be executed in a very short period of time compared to a period of time required for preparing the shooting operation. Accordingly, as shown in FIG. 10, it is possible to execute the test mode prior to the transfer of the image data generated by capturing an image, and to optimize the phase of the clock signal. Subsequently, by transferring the image data generated by capturing the image using the clock signal having the optimized phase, a favorable data transfer can be realized.

Further, the series of processings described above may also be realized as hardware or software by configuring an appropriate circuit.

Figure 11A:
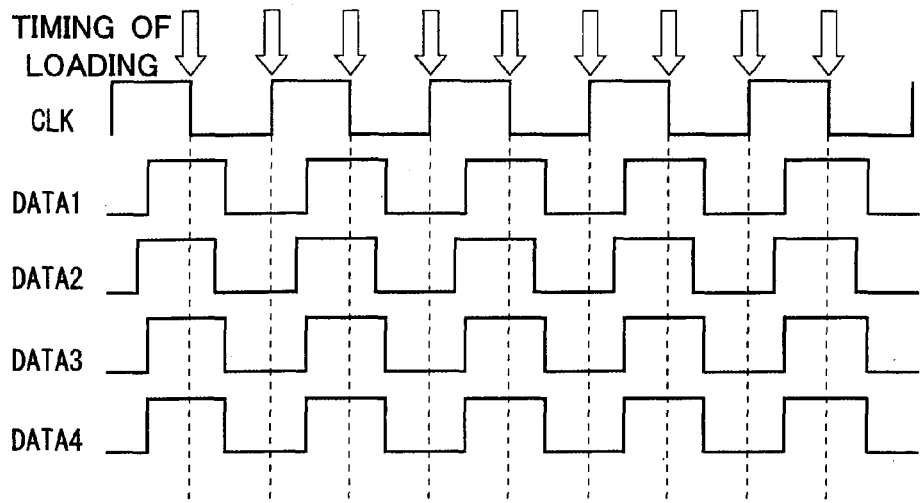
FIG. 11A is a schematic view which explains an effect of the one embodiment.
Figure 11B:
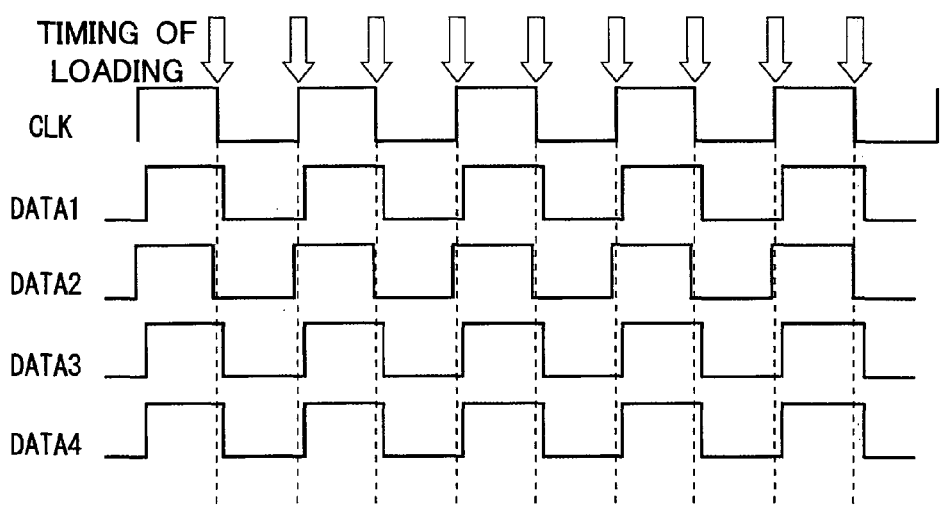
FIG. 11B is another schematic view which explains the effect of the one embodiment.
Figure 11C:
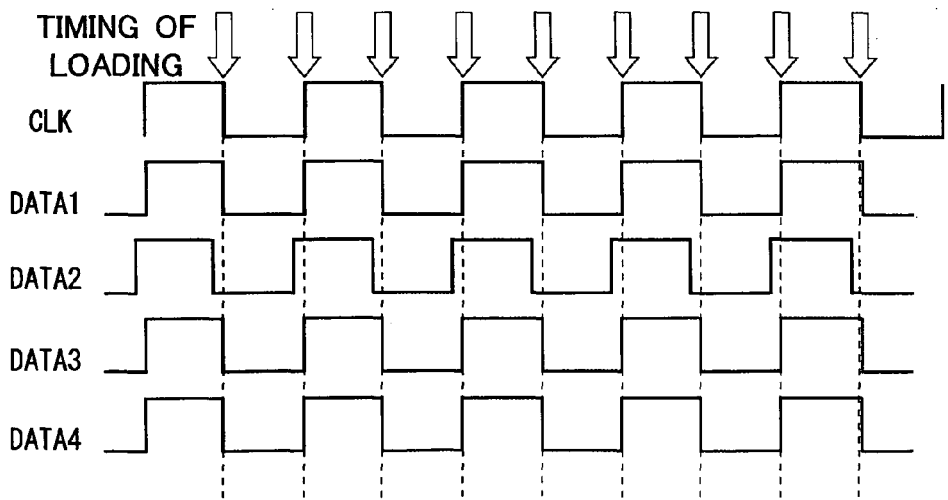
FIG. 11C is still another schematic view which explains the effect of the one embodiment.

By conducting an adjustment such as described above, the phase of the clock signal can be adjusted to be optimized, as shown in FIG. 11A. Therefore, it is possible to solve a problem that the loading of a part of the image signals (FIG. 11B: DATA 2) itself becomes impossible and that the loading of a part of the image signals (FIG. 11C: DATA 1, DATA 3 and DATA 4) becomes unstable, respectively as shown in FIG. 11B and FIG. 11C. Specifically, according to the one embodiment, it is possible to adjust the phase of the clock signal with a simple configuration in a short period of time when the digital data signal is transferred in synchronization with the clock signal.

In particular, it is possible to save time and cost for the calculation of transmission path and the like, and to flexibly deal with the shifting amount of the clock signal which varies depending on a temperature, a humidity, a lapse of years, a change in voltage and the like. Further, it is also favorable when transferring the image signals in a serial scheme using a plurality of signal lines.

<Explanation of Other Embodiments>

Figure 7:
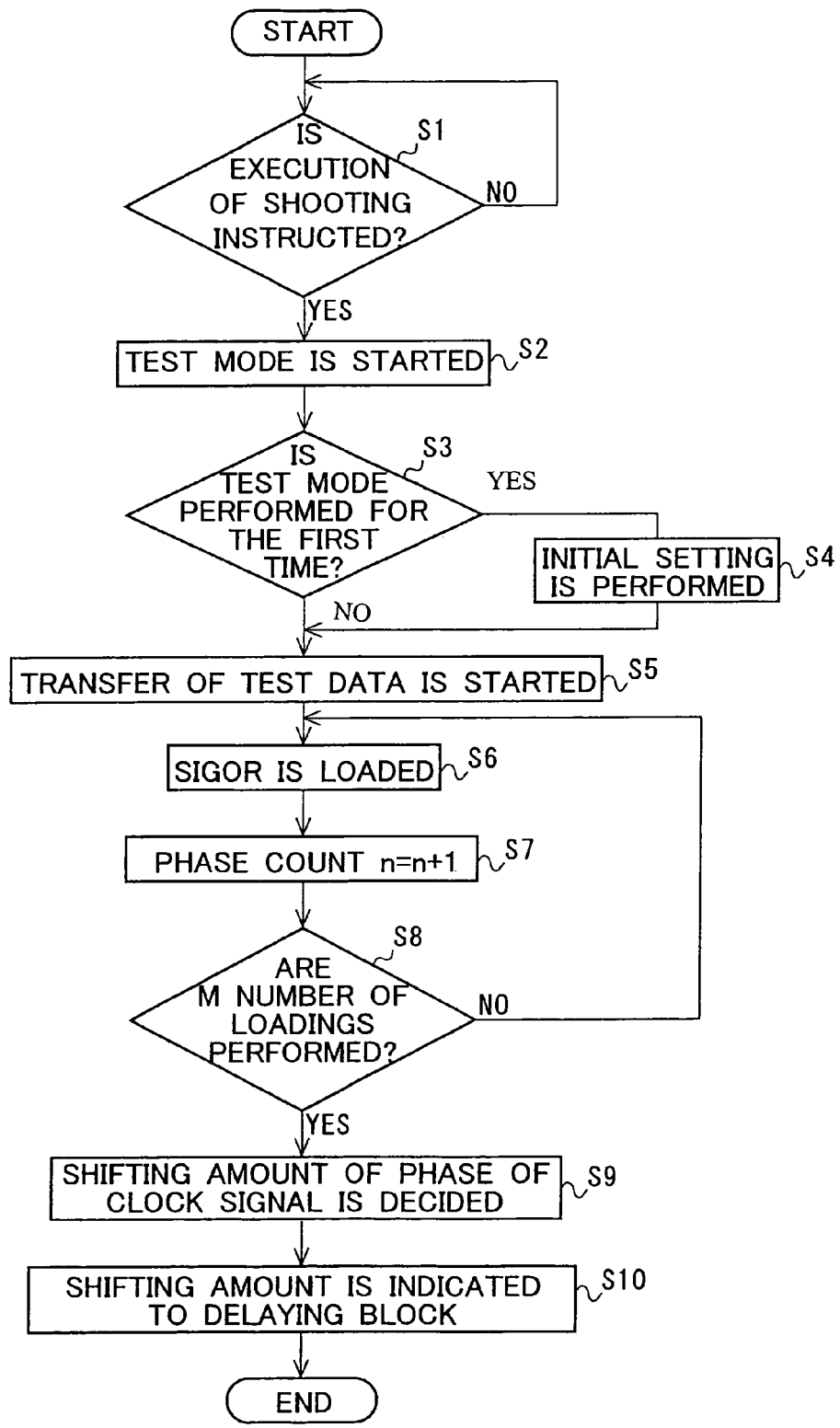
FIG. 7 is a flow chart which explains an adjustment of a phase of a clock signal.
Figure 12:
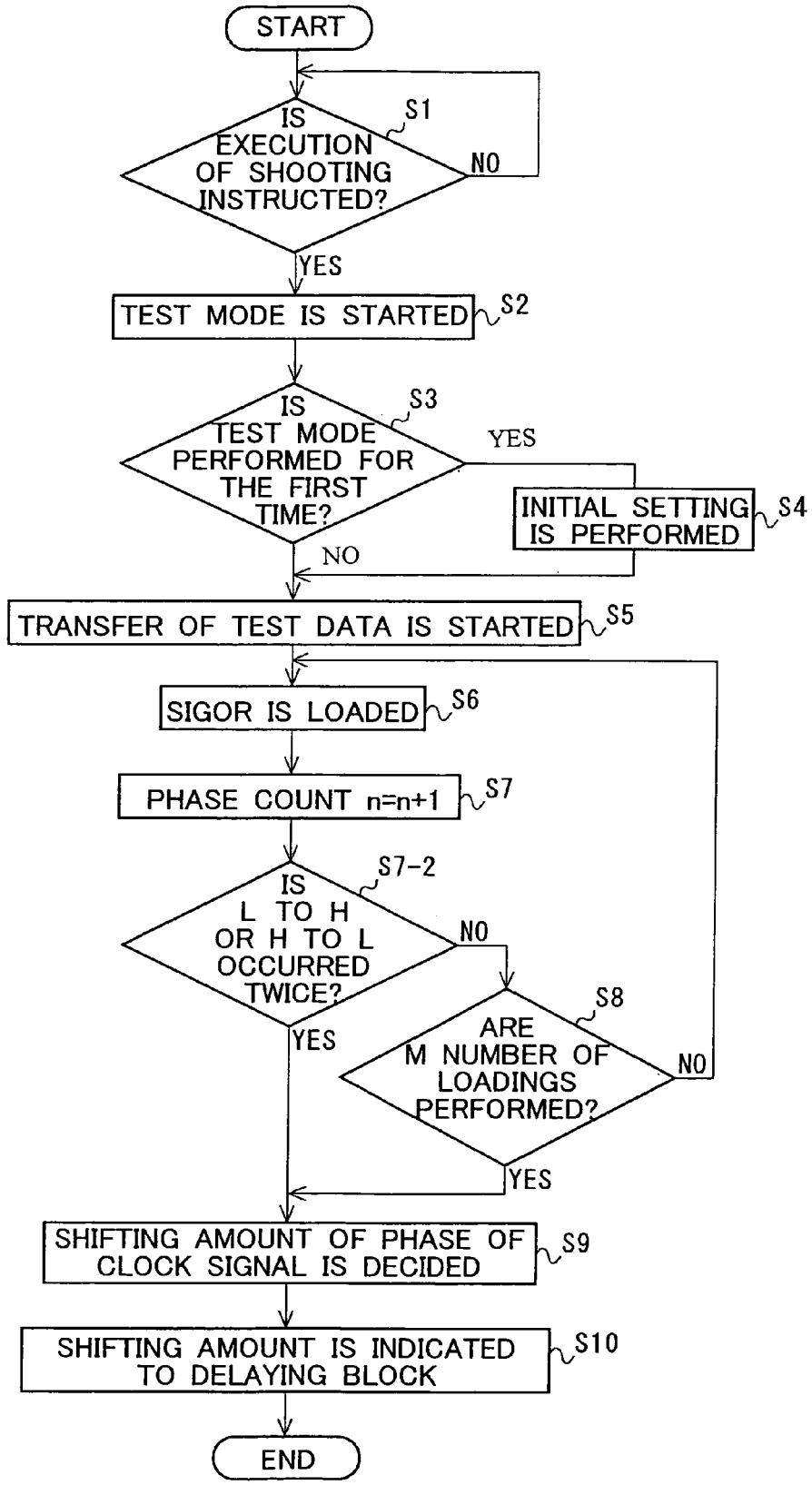
FIG. 12 is another flow chart which explains the adjustment of the phase of the clock signal.

FIG. 12 is a modification example of the flow chart of FIG. 7. As shown in FIG. 12, step S7-2 can be provided between step S7 and step S8 which were described in FIG. 7.

Specifically, in step S7-2, the controlling part 17 observes the state of SIGOR, and proceeds to step S9 at the time when the change of the SIGOR from the Low state to the High state or the change of the SIGOR from the High state to the Low state occurs twice. By configuring as above, the time required for the execution of the test mode can be reduced.

Figure 13:
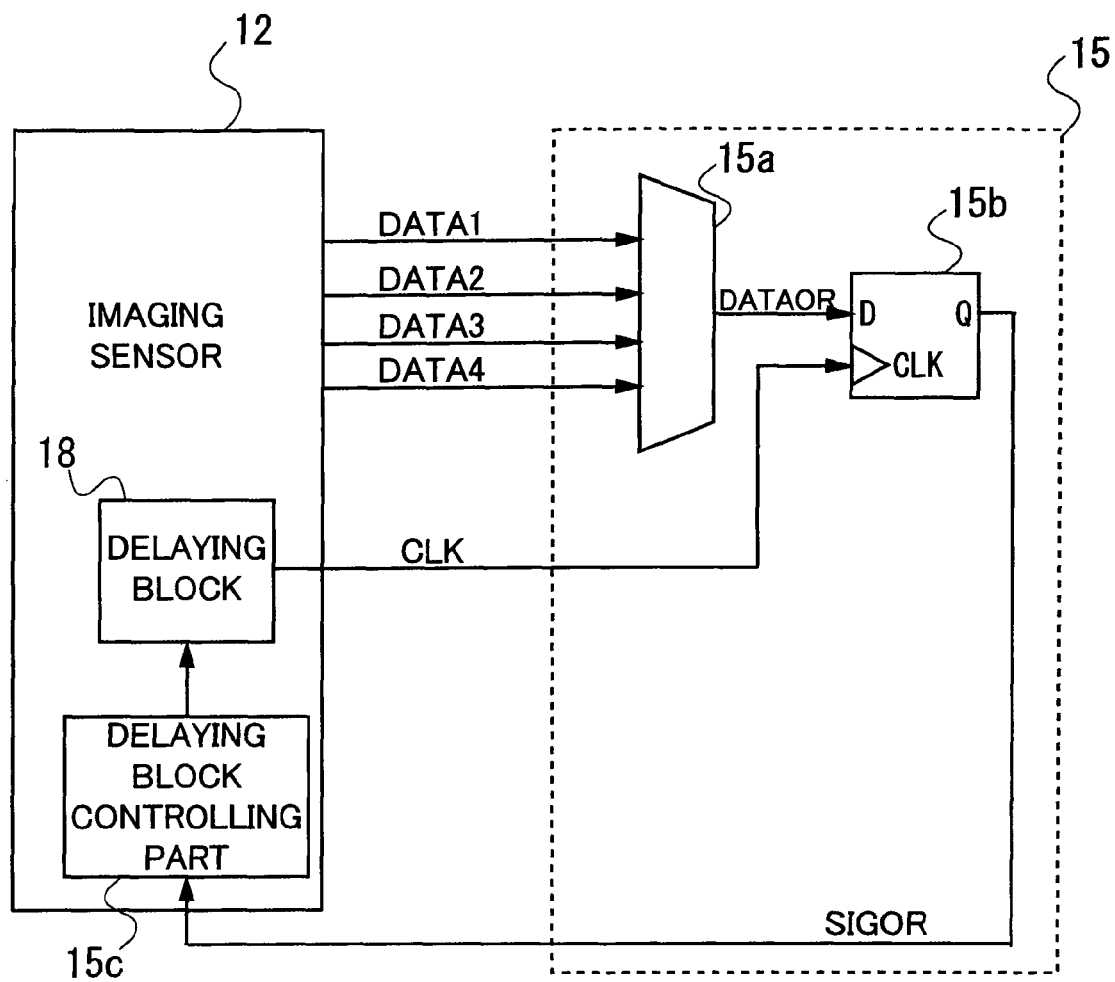
FIG. 13 is a schematic view which explains an imaging sensor 12 and an adjustment processing part 15 according to another embodiment.
Figure 14:
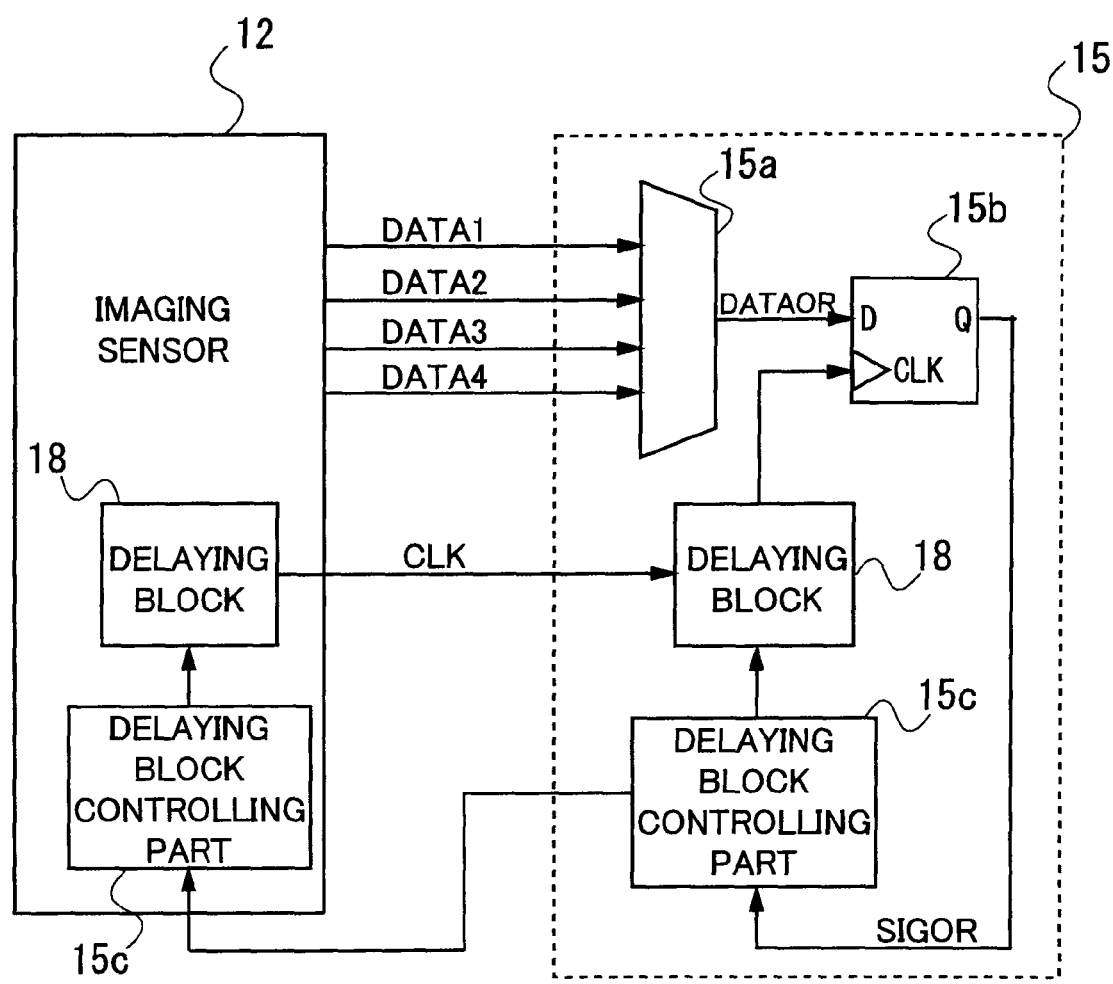
FIG. 14 is a schematic view which explains an imaging sensor 12 and an adjustment processing part 15 according to still another embodiment.

FIG. 13 and FIG. 14 are schematic views showing configuration examples of an imaging sensor 12 and an adjustment processing part 15 according to other embodiments.

Note that the other embodiments shown in FIG. 13 and FIG. 14 are modification examples of FIG. 4 of the one embodiment, and components common to FIG. 4 are designated by the same reference numerals and an overlapped explanation thereof will be omitted.

In an example of FIG. 13, the delaying block 18 and the delaying block controlling part 15c are provided in the imaging sensor 12 being a transmitting end. By feeding back the SIGOR output from the loading circuit 15b from the signal processing circuit 13 being the receiving end to the imaging sensor 12, it is possible to obtain substantially the same effect as that of the aforementioned one embodiment. By configuring as above, the whole configuration can be further simplified. Meanwhile, if the configuration of the one embodiment is adopted, there is no need to perform the feedback from the signal processing circuit 13 to the imaging sensor 12.

In an example of FIG. 14, the delaying block 18 and the delaying block controlling part 15c are provided not only in the signal processing circuit 13 being the receiving end but also in the imaging sensor 12 being the transmitting end. By performing the series of processings explained in the one embodiment in the signal processing circuit 13, and by feeding back only the determined shifting amount of the phase of the clock signal from the signal processing circuit 13 to the imaging sensor 12, it is possible to obtain substantially the same effect as that of the aforementioned one embodiment.

<Supplemental Matters to Embodiments>

(1) The aforementioned respective embodiments were explained by citing cases, as examples, where the phase of the clock signal is adjusted when the shooting instruction is given by the user. However, the data transfer device is not limited to the examples of the aforementioned embodiments, and, for example, it may be configured to perform the adjustment of the phase of the clock signal repeatedly at an appropriate time interval (for example, at a time interval of one minute). Further, when it takes a long time to transfer the data, it is also possible to configure that the adjustment of the phase of the clock signal is performed at an intermediate timing.

(2) In the aforementioned respective embodiments, examples of the data transfer device which performs the serial transfer using four signal lines were explained. However, the data transfer device is not limited to the examples of the aforementioned embodiments, and it can be naturally applied to a data transfer device which performs the serial transfer using one signal line or a data transfer device which performs the serial transfer using five or more signal lines, for instance.

(3) In the aforementioned embodiments, examples of data transfer between the imaging sensor 12 and the signal processing circuit 13 in the camera were explained, but, the data transfer device can also be applied to a data transfer between other elements in the camera. Further, the data transfer device can also be applied to digital processing circuits to be built in other electronic devices. Furthermore, the data transfer device can also be applied to a data transfer using a wire between mutually independent electronic devices.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A data transfer device transferring a digital data signal in synchronization with a clock signal, comprising:
    a data transfer line serially transferring the data signal;
    a clock transfer line transferring the clock signal;
    a decision unit deciding an adjustment amount by which a phase of the clock signal accompanying the data signal is shifted, the adjustment amount being used when transferring the data signal in synchronization with the clock signal; and
    a phase adjusting unit shifting the phase of the clock signal in accordance with the adjustment amount decided by the decision unit while keeping a frequency of the clock signal fixed, wherein
    the decision unit repeatedly transfers a test signal in synchronization with the clock signal while shifting the phase of the clock signal and decides the adjustment amount based on the transferred test signal and the clock signal, the test signal being a digital data signal for test, and
    the test signal is a binary signal whose signal values alternately change in the same cycle as that of the clock signal.

2. The data transfer device according to claim 1, further comprising
    a plurality of the data transfer lines, wherein
    the decision unit transfers the test signal with respect to each of the plurality of the transfer lines in synchronization with the clock signal and decides the adjustment amount based on a synthesized signal of a plurality of transferred test signals and the clock signal.

3. An electronic camera, comprising:
    the data transfer device according to claim 1; and
    an image-capturing unit capturing a subject image and generating a digital image signal, wherein
    the data transfer line serially transfers the image signal as the data signal.

4. The electronic camera according to claim 3, wherein
    the decision unit decides the adjustment amount right before serially transferring the image signal.

5. A data transfer device formed of a transmitting unit transmitting a digital data signal in synchronization with a clock signal and a receiving unit receiving the data signal in synchronization with the clock signal, the data transfer device, comprising:
    a data transfer line serially transferring the data signal from the transmitting unit to the receiving unit; and
    a clock transfer line transferring the clock signal from the transmitting unit to the receiving unit, wherein
    the receiving unit comprises:
    a decision unit deciding an adjustment amount by which a phase of the clock signal accompanying the data signal is shifted, the adjustment amount being used when receiving the data signal in synchronization with the clock signal; and
    a phase adjusting unit shifting the phase of the clock signal in accordance with the adjustment amount decided by the decision unit while keeping a frequency of the clock signal fixed, wherein
    the decision unit repeatedly transfers a test signal in synchronization with the clock signal while shifting the phase of the clock signal and decides the adjustment amount based on the transferred test signal and the clock signal, the test signal being a digital data signal for test, and
    the test signal is a binary signal whose signal values alternately change in the same cycle as that of the clock signal.

6. An electronic camera, comprising:
    the data transfer device according to claim 5; and
    an image-capturing unit capturing a subject image and generating a digital image signal, wherein
    the data transfer line serially transfers the image signal as the data signal.

7. A data transfer device formed of a transmitting unit transmitting a digital data signal in synchronization with a clock signal and a receiving unit receiving the data signal in synchronization with the clock signal, the data transfer device, comprising:
    a data transfer line serially transferring the data signal from the transmitting unit to the receiving unit; and
    a clock transfer line transferring the clock signal from the transmitting unit to the receiving unit, wherein
    the transmitting unit comprises:
    a decision unit deciding an adjustment amount by which a phase of the clock signal accompanying the data signal is shifted, the adjustment amount being used when transmitting the data signal in synchronization with the clock signal; and
    a phase adjusting unit shifting the phase of the clock signal in accordance with the adjustment amount decided by the decision unit while keeping a frequency of the clock signal fixed, wherein
    the decision unit repeatedly transfers a test signal in synchronization with the clock signal while shifting the phase of the clock signal and decides the adjustment amount based on the transferred test signal and the clock signal, the test signal being a digital data signal for test, and
    the test signal is a binary signal whose signal values alternately change in the same cycle as that of the clock signal.

8. An electronic camera, comprising:
    the data transfer device according to claim 7; and
    an image-capturing unit capturing a subject image and generating a digital image signal, wherein
    the data transfer line serially transfers the image signal as the data signal.

9. A data transfer device formed of a transmitting unit transmitting a digital data signal in synchronization with a clock signal and a receiving unit receiving the data signal in synchronization with the clock signal, the data transfer device, comprising:
- a data transfer line serially transferring the data signal from the transmitting unit to the receiving unit; and
- a clock transfer line transferring the clock signal from the transmitting unit to the receiving unit, wherein:
- the receiving unit comprises:
- a decision unit deciding an adjustment amount by which a phase of the clock signal accompanying the data signal is shifted, the adjustment amount being used when transmitting the data signal in synchronization with the clock signal by the transmitting unit; and
- a providing unit providing the adjustment amount decided by the decision unit to the transmitting unit; and
- the transmitting unit comprises
- a phase adjusting unit shifting the phase of the clock signal in accordance with the adjustment amount provided by the providing unit while keeping a frequency of the clock signal fixed, wherein the decision unit repeatedly transfers a test signal in synchronization with the clock signal while shifting the phase of the clock signal and decides the adjustment amount based on the transferred test signal and the clock signal, the test signal being a digital data signal for test, and the test signal is a binary signal whose signal values alternately change in the same cycle as that of the clock signal.

10. An electronic camera, comprising:

the data transfer device according to claim 9; and an image-capturing unit capturing a subject image and generating a digital image signal, wherein the data transfer line serially transfers the image signal as the data signal.

* * * * *